United States Patent [19]

Nishizawa et al.

[11] Patent Number: 4,651,180
[45] Date of Patent: Mar. 17, 1987

[54] SEMICONDUCTOR PHOTOELECTRIC TRANSDUCER

[75] Inventors: Jun-ichi Nishizawa, No. 6-16, Komegafukuro 1-chome, Sendai-shi, Miyagi-ken, 980; Takashige Tamamushi; Kaoru Motoya, both of Sendai, all of Japan

[73] Assignee: Jun-ichi Nishizawa, Japan

[21] Appl. No.: 559,763

[22] Filed: Dec. 9, 1983

[30] Foreign Application Priority Data

Dec. 11, 1982 [JP] Japan .............................. 57-217527

[51] Int. Cl.⁴ ............................................ H01L 29/80
[52] U.S. Cl. ......................................... 357/22; 357/30
[58] Field of Search ..................................... 357/22, 30

[56] References Cited

U.S. PATENT DOCUMENTS 4,427,990 1/1984 Nishizawa ............................. 357/30

Primary Examiner—William L. Sikes
Assistant Examiner—Robert E. Wise
Attorney, Agent, or Firm—McGlew and Tuttle

[57] ABSTRACT

The present invention relates to a semiconductor FET or SIT type photoelectric transducer comprising a source and a drain which are main electrode regions of high impurity density; a high resistivity or intrinsic semiconductor region of the same conductivity type as the main electrode regions and formed therebetween as a current path; and a plurality of gate regions formed by high impurity density regions reverse in conductivity from the main electrode regions and formed in the current path, for controlling a main current; wherein the distance $W_1$ between a first one of the gate regions on both sides of the source and the source or the drain is greater than the distance $W_2$ between the other gate region and the source or drain ($W_1 > W_2$), and wherein the size of the first gate region is smaller than the diffusion length of carriers to be stored in the first gate region. Briefly stated, the present invention is intended to enhance the function of the first gate by selecting the size of the first gate region for storing optical information within the diffusion length of the carriers stored therein, in addition to the selection of the aforementioned distances $W_1$ and $W_2$.

3 Claims, 17 Drawing Figures

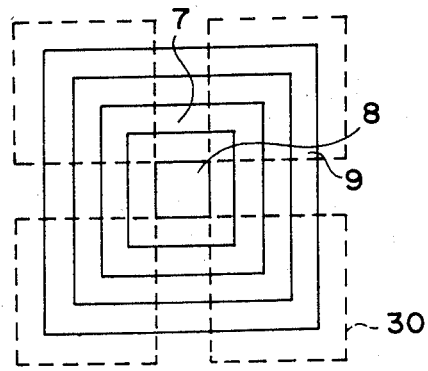
FIG. 1D
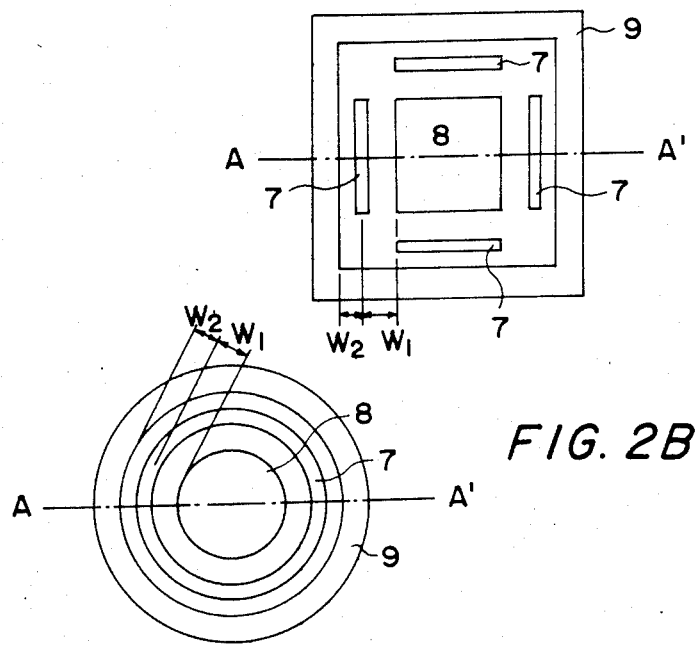
FIG. 2A
FIG. 2B

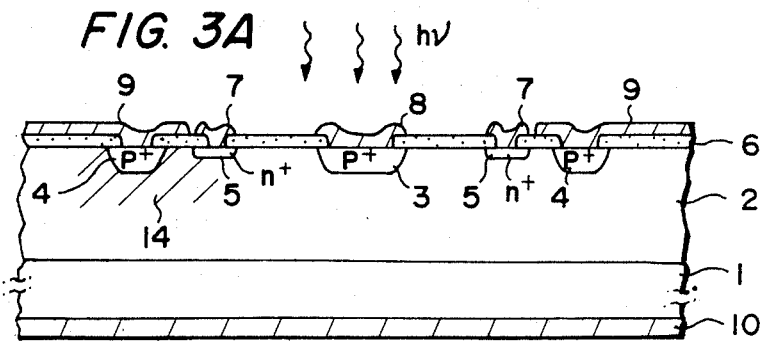
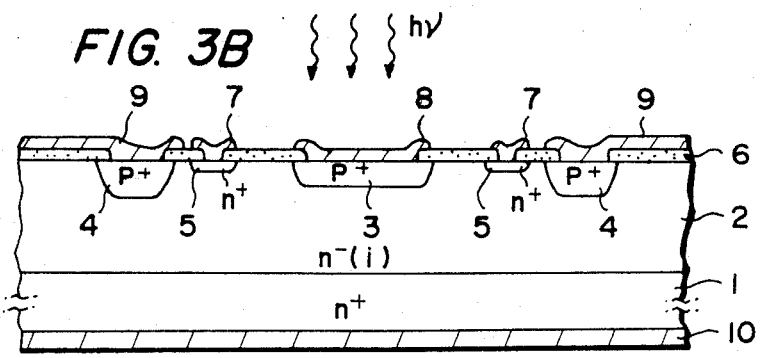
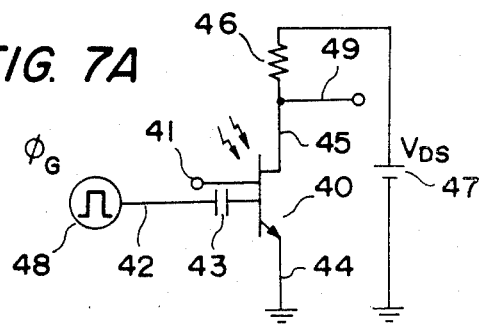
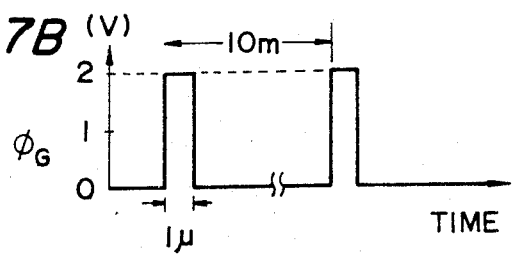

SEMICONDUCTOR PHOTOELECTRIC TRANSDUCER

BACKGROUND OF THE INVENTION

1. Field of the Invention

The present invention relates to a semiconductor photoelectric transducer.

2. Description of the Prior Art

Semiconductor photoelectric transducers are known diodes, such as a p-i-n photo proposed by one of the inventors of the present invention, and an avalanche photo diode and so on. Further, a bipolar phototransistor and the like are also known. The inventors of the present invention have proposed, as high-sensitivity, high-speed and low-noise phototransistors, a field effect transistor and a static induction transistor (hereafter referred to as an SIT) which are provided with a channel having a low impurity density or formed of an intrinsic semiconductor in Japanese Patent Application Nos. 86572/78 (U.S. Ser. No. 39,445), 87988/78 (Laid-Open Publication No. 19229/80) and now U.S. Pat. No. 4,427,990, 192417/81 (U.S. Ser. No. 522,307 and European Patent Application No. 829034768), 194286/81 (U.S. Ser. No. 522,153 and European Patent Application No. 82-903,477.6) for infrared light detection and 153429/81 (PCT/JP83/00295) for improved structure. These photoelectric transducers are very high-sensitivity and high-speed, and hence are very excellent in characteristic as compared with the conventional bipolar phototransistors.

FIGS. 1A to 1D illustrate prior semiconductor photoelectric transducers proposed by the inventors of the present invention, which are provided with at least one or more gates. Reference numeral 1 indicates an n+ substrate of silicon; 2 designates a low-resistivity n-layer or an i layer of an intrinsic semiconductor which will ultimately serve as a channel; 3 identifies a first gate region of high impurity density and reverse in conductivity type from the channel; 4 denotes a second gate region of high impurity density and reverse in conductivity type from the channel as is the case with the first gate region 3; 5 represents a high impurity density region of the same conductivity type as the substrate 1; 7 and 10 respectively show electrodes of the substrate 1 and the region 5 which form a main current path of the channel; 8 refers to a gate electrode of the first gate region 3; 9 signifies a gate electrode of the second gate region 4; and 6 indicates a multilayer film as of $SiO_2$, $Si_3N_4$ or the like which forms an insulating film layer or insulating layer which performs known functions of insulation for isolating the electrodes 7, 8 and 9 and provides surface protection.

With the prior semiconductor photoelectric transducer shown in FIG. 1A, since the first and second gate regions 3 and 4 are provided symmetrically with respect to the main electrode region 5, diffusion potentials between both gate regions 3 and 4 and the main electrode region 5 are equal to each other, making it difficult to separate the functions of the two gates. The prior semiconductor photoelectric transducers shown in FIGS. 1B and 1C have the structure that the distance $W_1$ between the first gate region 3 and the main electrode region 5 is larger than the distance $W_2$ between the second gate region 4 and the main electrode region 5, thereby facilitating the storage of optically excited carriers in the first gate region 3 alone. These semiconductor photoelectric transducers are excellent in optical characteristics as compared with the semiconductor photoelectric transducer depicted in FIG. 1A.

FIG. 1D schematically shows the outline of the surface of such a prior semiconductor photoelectric transducer. Reference numeral 8 indicates the electrode region of the first gate region 3, 9 the electrode region of the second gate region 4 and 7 the electrode region of the main diffused electrode region 5. With such a electrode pattern, it has been clarified that since the distances between the gate regions 8 (3) and 9 (4) and the main electrode region 7 (5) differ from each other, the parts 30 surrounded by the broken lines and the non-surrounded parts differ in channel width to cause variations in the characteristic of the SIT, making it impossible for the SIT to direct the current uniformly in the channel.

SUMMARY OF THE INVENTION

The present invention is directed to a field effect transistor and/or an SIT which is provided with at least two or more gate electrodes of different functions and a channel having a low impurity density or formed of an intrinsic semiconductor. More particularly, the present invention pertains to a semiconductor photoelectric transducer in which the size of the first gate region for storing optically excited carriers is formed smaller than the diffusion length of the stored carriers, thereby ensuring high photosensitivity, excellent frequency characteristic and high-speed operation.

It is therefore an object of the present invention to provide a semiconductor photoelectric transducer in which the functions of the first and second gate regions are efficiently separated and the optically excited carriers are stored exclusively in the first gate region, thereby providing for improved photosensitivity and photo responsibility. Briefly stated, the present invention is intended to enhance the function of the first gate by selecting the size of the first gate region for storing optical information within the diffusion length of the carriers stored therein, in addition to the selection of the aforementioned distances $W_1$ and $W_2$.

BRIEF DESCRIPTION OF THE DRAWINGS

FIGS. 1A, 1B, 1C, and 1D show prior art examples of photoelectric transducers using a split gate SIT, FIG. 1A showing a structure in which the source is disposed centrally between the gates, FIG. 1B a structure in which the source is not disposed centrally between the gates, FIG. 1C a structure in which the gates are formed deeper than the source and FIG. 1D showing the surface structure of the prior art examples depicted in FIGS. 1B and 1C;

FIGS. 2A, 2B, 2C, and 2D schematically illustrate embodiments of the present invention, FIG. 2A being a top plan view of the device having a square configuration, Fiq. 2B a top plan view of the device having a circular configuration, FIG. 2C a sectional view taken on the line A—A' in FIGS. 2A and 2B and FIG. 2D a top plan view of an example of a multichannel cell;

FIGS. 3A and 3B schematically illustrate other embodiments of the present invention, FIG. 3A being a sectional view of an example in which the impurity density of the channel in the vicinity of the second gate is higher than the impurity density of the channel near the first gate and FIG. 3B a sectional view of an example in which the diffusion depth of the second gate is larger than the diffusion depth of the first gate;

FIGS. 7A, 7B and 7C are explanatory of experimental results of an embodiment of the present invention, FIG. 7A showing an operating circuit, FIG. 7B an operating waveform and FIG. 7C the relationships between the output voltage and the intensity of incident light.

DESCRIPTION OF THE PREFERRED EMBODIMENTS

With reference to the drawings, the present invention will hereinafter be described in detail.

Figure 2C:
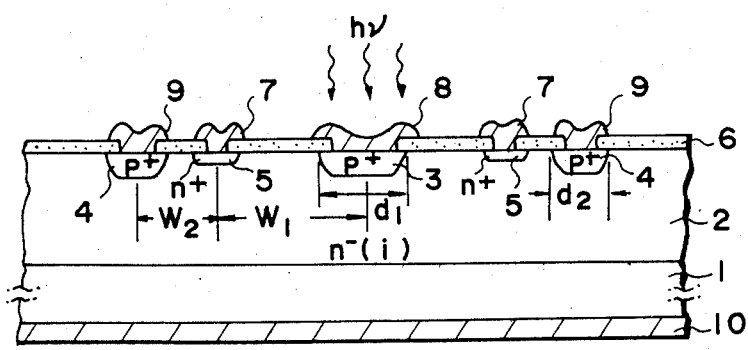

FIGS. 2A to 2D shown the basic structure of the photoelectric transducer of the present invention and its embodiments. FIGS. 2A and 2B show the surface configurations of the photoelectric transducers of the present invention. In FIG. 2A the diffused region of the main electrode (the source or drain) 5 is divided into four parts, and the first and second gate regions 3 and 4 are formed so that the aforesaid condition, $W_1 > W_2$, may be satisfied. The embodiment of FIG. 2B employs a circular electrode structure to increase the effective operating area. Of course, the main electrode 7 and the first and second gate electrodes 8 and 9 may also be provided in the form of known bonding pads using multilayer wiring with proper intermediate isolation layer. FIG. 2C is a sectional view taken on the line A—A40 in FIGS. 2A and 2B. The n+ region of the main electrode region 5 is formed by selective diffusion or ion implantation of phosphorus or arsenic lest such an n+ region should be formed at other positions.

Figure 2D:
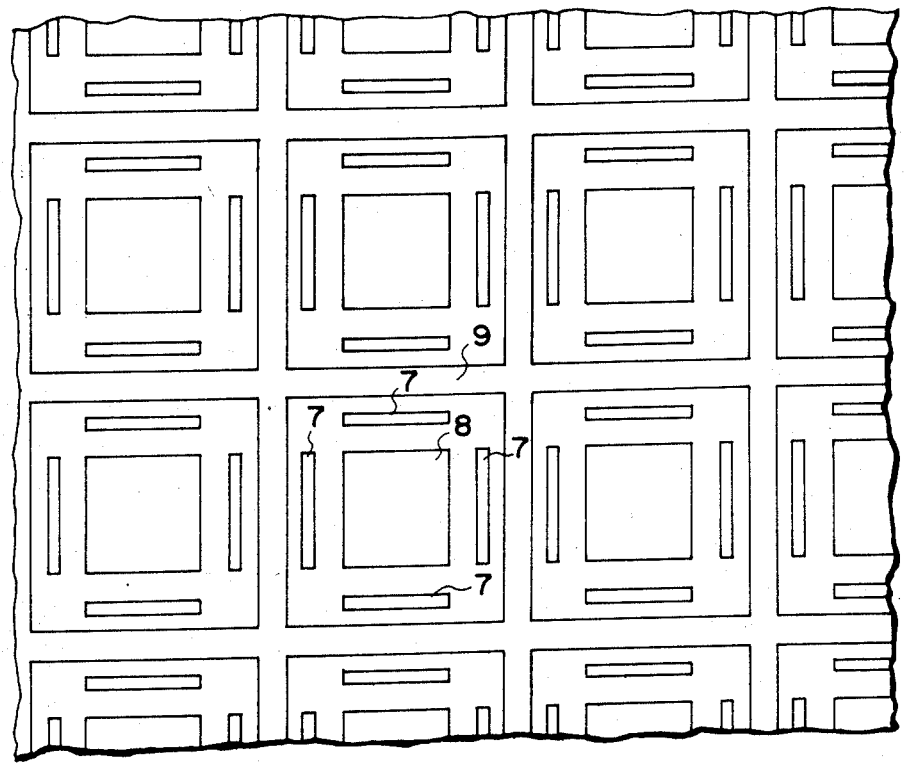

FIG. 2D is a top plan view showing a multi-channel arrangement for producing photocurrent in quantity. Needless to say, the main electrodes 7 and the first and second gate electrodes 8 and 9 can be interconnected by a known method. The embodiment of FIG. 2D can be regarded as a multi-channel photo sensor assembly in which a plurality of photo sensor cells are activated in parallel. It is the p+ gate region that stores optically excited carriers (holes), and there is the probability that the carriers are stored in both of the first gate region 3 or 8 and the second gate region 4 or 9, but this embodiment is designed to store the carriers as optical information in the specified first gate region 3 or 8 in the same manner as in the prior art example proposed by one of the inventors of the present invention. This can be achieved, for example, by providing light shielding means on the second gate region 4 so that light is incident only on the first gate region and the adjoining channel. It is preferable that the n+ diffused region 5 of the main electrode 7 be formed further to the side of the second gate region 4 than the center between the first and second gate regions 3 and 4 by a predetermined distance. In such a split gate SIT, it is necessary that the size of the first gate region 3 for storing the optically excited carriers be smaller than the diffusion length of the carriers to be stored. The reason for this is that when the first gate region 3 is larger than the diffusion length of the carriers, flowing of carriers in the region outside of their diffusion length causes wasteful power dissipation, resulting in decreased response speed and impaired photoelectric transducing efficiency. Accordingly, in order to receive incident light with high efficiency, in the case of the square structure as shown in FIG. 2A, each side of the first gate region 3 is selected smaller than the diffusion length of the carriers to be stored and, in the case of the circular structure as shown in FIG. 2B, the diameter of the first gate region 3 is selected within the diffusion length of the carriers.

Further, the photo sensor of the present invention is given consideration in terms of its frequency characteristic. According to our experimental results, the device of the present invention showed a qain band width $f_T$ of about $10^9$ (Hz). In order to improve the frequency characteristic, the device of the present invention is designed to minimize the area of the first gate region and to maximize the diffusion length of the n+ source region of the main electrode region 7 per unit area. For instance, the area of the first gate region is $50 \times 50\mu$, the distance between the first and second gate regions is 4 to $10\mu$ and the total diffusion length of the n+ source region of the main electrode region 7 disposed around the first gate region is $100\mu$. With such dimensions, the capacity of the first gate is 2 to 3 pF, the output current in the case of irradiation by light of 1 $\mu W/cm^2$ is several mA and a characteristic with $f_T \simeq 10^9$ Hz. The second gate may be set to a fixed potential or held in an electrically floating condition; especially, in the case of the fixed potential, the capacitance of the second gate has nothing to do with the frequency characteristic and this is also one of the causes of excellent frequency characteristic.

FIGS. 3A and 3B illustrate other embodiments of the present invention, which are designed so that the diffusion potential developed between the second gate region 4 and the source region 7 is higher than the diffusion potential between the first gate region 3 and the source region 7. To this end, in FIG. 3A, a region 14 of high impurity density is provided between the second gate region 4 and the source region 7 and, in FIG. 3B, the second gate region 4 is made larger in size than the first gate region 3. In these embodiments, means are provided for preventing the elctrode 9 on the second gate region 4 from being exposed to irradiation by light.

With such an arrangement, carriers excited by light irradiation are efficiently stored in the first gate region 3 but are not readily stored in the second gate region 4, providing for raised photoconductivity.

Figure 4A:
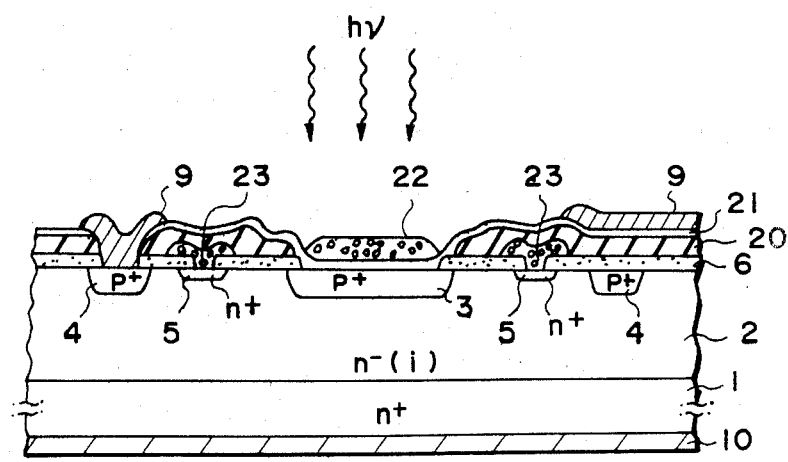
FIGS. 4A and 4B schematically illustrate another embodiment of the present invention in which a capacitor is built in the first gate, FIG. 4A being its sectional view and FIG. 4B its plan view.

FIGS. 4A to 6 illustrate other embodiments of the semiconductor photoelectric transducer of the present invention in which a capacitor is provided on the first gate region. In the embodiment of FIG. 4A, which is a sectional view taken on the line a—a' in FIG. 4B, the capacitor on the first gate region 3 is formed by an $Si_3N_4$ film 21 and a polycrystalline silicon film doped with phosphorus or an $SnO_2$ film 22 serving as a transparent electrode. Reference numeral 20 indicates a PSG film for surface protection, and 23 designates a source electrode formed by a phosphorus-doped polycrystalline silicon film or $SnO_2$ film.

Figure 4B:
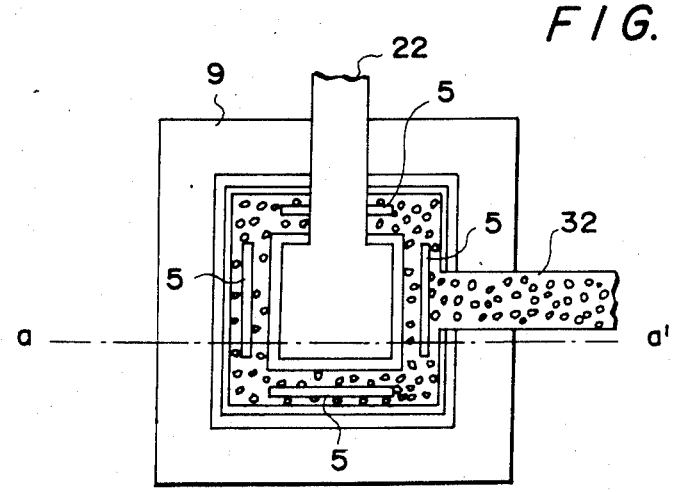

FIG. 4B shows the surface structure of the embodiment of FIG. 4A. Reference numeral 32 indicates a source electrode wiring portion.

Figure 5:
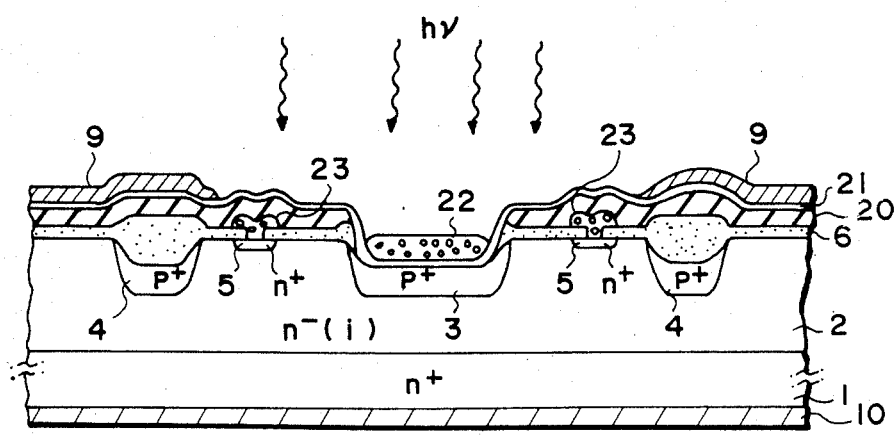
FIG. 5 schematically illustrates a modified form of the embodiment of FIGS. 4A and 4B.
Figure 6:
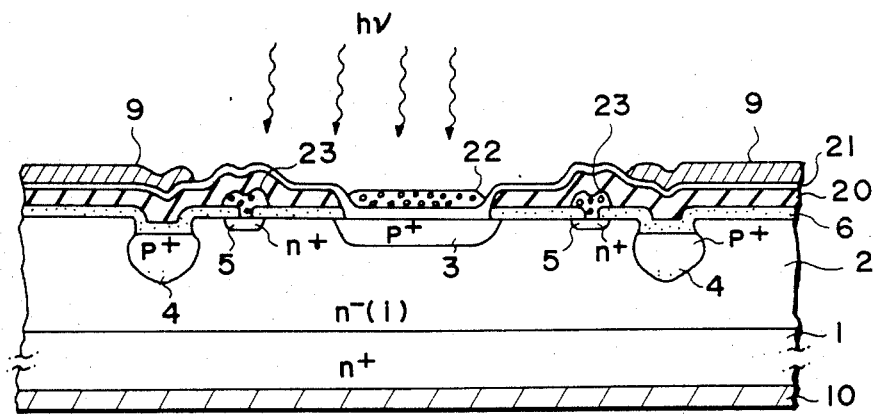
FIG. 6 schematically illustrates another modification of the embodiment of FIGS. 4A and 4B.

The embodiments of FIGS. 5 and 6 are not the planar structure but instead the first or second gate region and the source region are formed in different planes through chemical etching, LOCOS or plasma etching techniques. The parts corresponding to those in FIGS. 4A and 4B are identified by the same reference numerals.

In the embodiment of FIG. 5 the first and second gate regions are formed deep by the LOCOS method and, in the embodiment of FIG. 6, the second gate region is formed deep by the plasma etching method.

With such an arrangement, the capacitance between the gate and source is reduced and the breakdown voltage therebetween is raised to improve frequency characteristic, permitting high-speed operation.

It is evident from the foregoing description that, in order to raise the diffusion potential between the second gate region and the source region higher than the diffusion potential between the first gate region and the source region, it is possible (1) to increase the impurity density of the second gate region higher than the impurity density of the first gate region, (2) to increase the impurity density of the channel region around the second gate region and the source region higher than in the other channel region and (3) to form a light shielding film in the channel region near the first and second gate regions, in combination with the condition $W_1 > W_2$.

While in the embodiment of FIG. 5 the first and second gate regions are formed by the LOCOS method, it is also possible to form only the second gate region by the LOCOS method.

Further, in the embodiment of FIG. 6 the first and second gate regions are formed by plasma etching, but it is also possible to form only the second gate region through plasma etching.

It is a matter of course to form the first and second gate regions deep by the combined use of the techniques mentioned above. Moreover, although in the embodiments of FIGS. 5 and 6 the capacitance of the MIS structure is formed in the first gate region, it is also possible to provide a semiconductor photoelectric transducer without the MIS capacitance as shown in FIG. 2C.

It is sufficient to select the impurity densities of the source, gate and channel regions around $1 \times 10^{18}$ cm$^{-3}$ or more, $1 \times 10^{18}$ cm$^{-3}$ or more and $10^{10}$ to $10^{16}$ cm$^{-3}$, respectively.

FIG. 7A shows a light signal detector using the semiconductor photoelectric transducer of the present invention which is illustrated in FIG. 5. In FIG. 7A, reference numeral 40 indicates the semiconductor photoelectric transducer of the present invention; 41 designates a second gate terminal; 42 identifies a first gate terminal; 43 denotes a capacitor provided on the second gate; 44 represents a source terminal; 45 shows a drain terminal; 46 signifies a load resistor; 47 refers to a drain-source voltage source $V_{DS}$; 48 designates a gate pulse source connected to the first gate; and 49 identifies an output terminal.

Figure 7C:
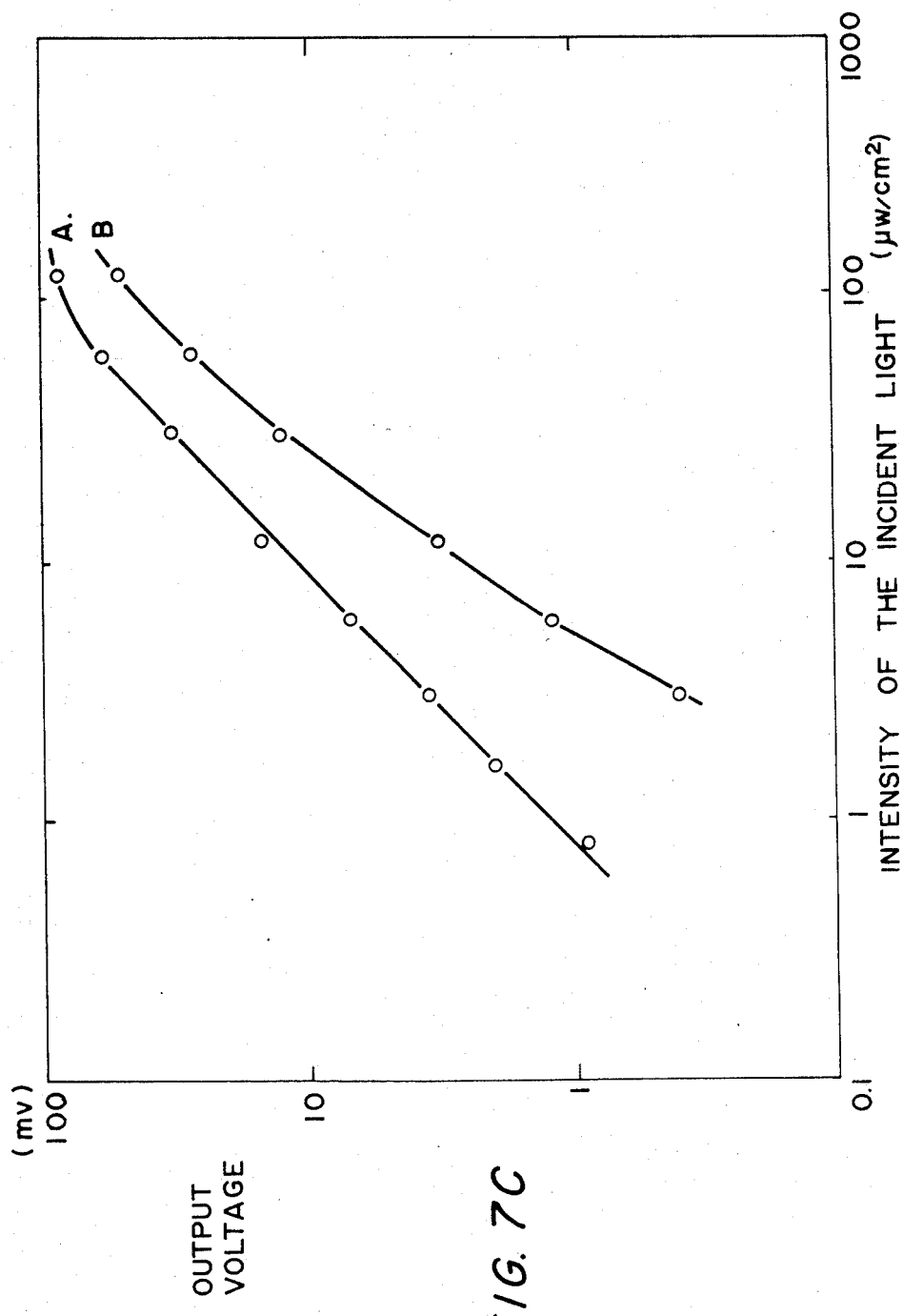

By applying, as $\phi_G$, a 2 V pulse such as shown in FIG. 7B in the case where the drain-source voltage $V_{DS}$ was 0.2 V, a load resistance was 1 KΩ and the second gate terminal 41 was opened, photoelectric conversion was carried out and a 1 mV output voltage was obtained with an input light of about 20 pW. FIG. 7C shows the relationship between the intensity of the incident light and the output voltage at that time, the curve A indicating the case of the path between the second gate and source being open and the curve B the case of a 1 MΩ resistor being connected between the second gate and source.

Figure 1A:
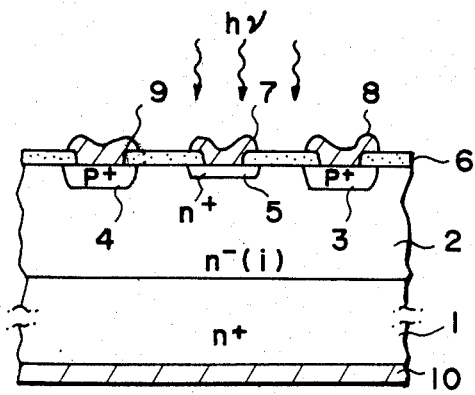
Figure 1B:
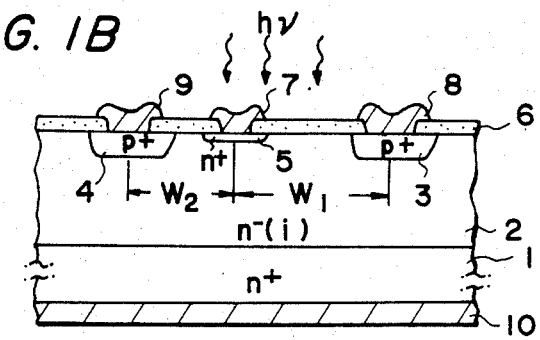
Figure 1C:
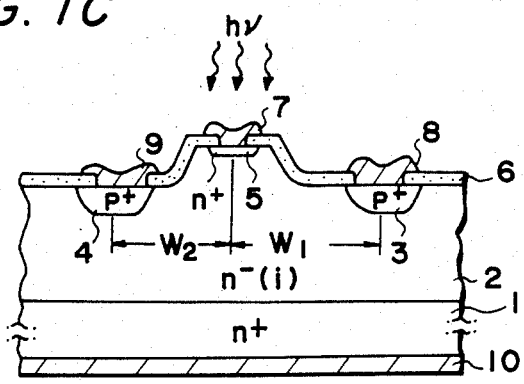

It was found that, as compared with the conventional semiconductor photoelectric transducer of such a structure as shown in FIG. 1B, the semiconductor photoelectric transducer of the present invention operates with a drain-source voltage and a readout pulse voltage one-half or lower than those needed in the prior art device and is large in photo sensitivity and small in power consumption and operates at very high speed.

Even if the second gate region and the source region are shorted, photo detection by the first gate region is normally performed and, in this case, the capacitance between the second gate region and the source region can be neglected and the stray capacitance between the gate region and the source region is substantially reduce, so that the area of the first gate region can be enlarged. This provides the advantage that even if the transducer is exposed to irradiation by high-intensity light, the optical signal is difficult to saturate. With the conventional semiconductor photoelectric transducer of FIG. 1B, the output saturation occurs with a light intensity of about 10 $\mu$W/cm$^2$, whereas, according to the present invention, the output saturation is not caused below 100 $\mu$W/cm$^2$ or so. That is to say, according to the present invention, the saturation characteristic of the output voltage with respect to the exposure is improved approximately ten times higher than that obtainable with an photoelectric transducer which is composed of a photodiode and an MOS transistor switch.

The embodiments of the present invention shown in FIGS. 2 through 7 possess the excellent features that they are easy to manufacture and can be reduced in size because they are formed substantially in the vertical structure, that the sensitivity to feeble light is higher than in the prior art devices because of the introduction of the structure in which the gate is split and a specified one of them is equipped with the light detecting function, that power dissipation is small, and that they are excellent in the output saturation characteristic and operates at high speed.

The structure of the present invention is subject to various modifications and variations. For instance, it is possible to provide a capacitor or a combination of a capacitor and a resistor on the first gate region; also it is possible to connect an MOS transistor, SIT or FET to the structure of the present invention to consititute a high-speed photo sensor.

The second gate region may be held floating, supplied with a fixed bias or added with a capacitor of large value. The present invention is applicable not only to the n-channel type but also to the p-channel type, and the material used is not always limited specifically to silicon but may also be germanium or a compound semidoncudtor (the III-V or II-VI group or mixed crystal).

The semiconductor photoelectric transducer of the present invention is sensitive to light in the range of from the infrared to the visible region but it will be able to detect the far infrared light, too, if an impurity level sensitive to the far infrared is provided in the forbidden band gap by adding a heavy metal into the channel region. Further, the transducer of the present invention is capable of sensing X-rays of short wavelength and high-energy particles (the $\alpha$-ray and $\beta$-ray) which creating electron-hole pairs. Accordingly, the present invention is of great industrial value.

It will be apparent that many modifications and variations may be effected without departing from the scope of the novel concepts of the present invention.

What is claimed is:

1. A semiconductor static induction transistor type photoelectric transducer comprising: a source and a drain which are main electrode regions of high impurity concentration; a high resistivity semiconductor region of the same conductivity type as the main electrode regions and formed between the main electrode regions as a current path; and first and second gate regions both formed by high impurity concentration regions reverse in conductivity type from the main electrode regions and both formed in the current path, for controlling a main current; wherein a distance $W_1$ between the first gate region and the source is greater than the distance $W_2$ between the second gate region and the source; and wherein the length of the first gate region is smaller than the diffusion length of carriers stored in the first gate region.

2. A semiconductor photoelectric transducer according to claim 1, including a capacitor structure formed on the first gate region, the capacitor structure comprising the sandwiched structure of metal layer, an insulator layer and a semi-conductor layer forming the first gate region.

3. A semiconductor photoelectric transducer according to claim 1, including a capacitor structure wherein the metal layer is formed of $SnO_2$ and the insulator layer is formed of silicon nitride.

* * * * *